(12) United States Patent
Weng et al.

(10) Patent No.: US 12,349,449 B2
(45) Date of Patent: *Jul. 1, 2025

(54) METHOD FOR FORMING SEMICONDUCTOR DEVICE AND RESULTING DEVICE

(71) Applicant: Taiwan Semiconductor Manufacturing Co., Ltd., Hsinchu (TW)

(72) Inventors: Tong-Min Weng, Hsin-Chu (TW); Tsung-Han Wu, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 58 days.

This patent is subject to a terminal disclaimer.

(21) Appl. No.: 18/113,516

(22) Filed: Feb. 23, 2023

(65) Prior Publication Data

US 2023/0207395 A1    Jun. 29, 2023

Related U.S. Application Data

(60) Continuation of application No. 16/673,794, filed on Nov. 4, 2019, now Pat. No. 11,610,823, which is a
(Continued)

(51) Int. Cl.
*H01L 29/78*     (2006.01)
*H01L 21/02*     (2006.01)
(Continued)

(52) U.S. Cl.
CPC ..... *H10D 84/038* (2025.01); *H01L 21/02126* (2013.01); *H01L 21/02131* (2013.01);
(Continued)

(58) Field of Classification Search
CPC ............... H01L 29/7848; H01L 29/785; H01L 29/78696; H01L 29/7831; H01L 29/7855; H01L 29/66439; H01L 29/6653; H01L 29/66545; H01L 29/66553; H01L 29/6656; H01L 29/66795; H01L 29/66484; H10D 64/671; H10D 64/017; H10D 64/021; H10D 30/024; H10D 30/019; H10D 30/0191; H10D 30/0193; H10D 30/0194; H10D 30/0195; H10D 30/0196; H10D 30/0197; H10D 30/0198; H10D 30/62; H10D 84/853; H10D 84/856

See application file for complete search history.

(56) References Cited

U.S. PATENT DOCUMENTS

6,613,637 B1    9/2003  Lee et al.
6,720,213 B1 *  4/2004  Gambino .......... H01L 21/26506
                                                438/303
(Continued)

*Primary Examiner* — Mary A Wilczewski
*Assistant Examiner* — Tsz K Chiu
(74) *Attorney, Agent, or Firm* — Harrity & Harrity, LLP (57) ABSTRACT

A semiconductor device includes: at least one gate structure comprising a gate electrode over a substrate, the gate electrode comprising a conductive material; and a first dielectric layer disposed along one or more side wall of the at least one gate structure, the first dielectric layer comprising fluorine doped silicon oxycarbonitride or fluorine doped silicon oxycarbide.

20 Claims, 10 Drawing Sheets

Related U.S. Application Data division of application No. 15/690,340, filed on Aug. 30, 2017, now Pat. No. 10,504,797.

(51) Int. Cl.

| | | |
|---|---|---|
| *H01L 21/28* | (2006.01) | |
| *H01L 21/311* | (2006.01) | |
| *H01L 21/3115* | (2006.01) | |
| *H01L 29/66* | (2006.01) | |
| *H10D 30/01* | (2025.01) | |
| *H10D 30/62* | (2025.01) | |
| *H10D 64/01* | (2025.01) | |
| *H10D 64/66* | (2025.01) | |
| *H10D 84/01* | (2025.01) | |
| *H10D 84/03* | (2025.01) | |
| *H10D 84/85* | (2025.01) | |

(52) U.S. Cl.
CPC ........ *H01L 21/0217* (2013.01); *H01L 21/022* (2013.01); *H01L 21/02321* (2013.01); *H01L 21/28123* (2013.01); *H01L 21/31155* (2013.01); *H10D 30/024* (2025.01); *H10D 30/62* (2025.01); *H10D 64/017* (2025.01); *H10D 64/021* (2025.01); *H10D 64/671* (2025.01); *H10D 84/0184* (2025.01); *H10D 84/0193* (2025.01); *H10D 84/853* (2025.01)

(56) References Cited

U.S. PATENT DOCUMENTS

| | | | |
|---|---|---|---|
| 7,115,974 B2 | 10/2006 | Wu et al. | |
| 7,227,230 B2 | 6/2007 | Gambino et al. | |
| 7,365,378 B2* | 4/2008 | Huang ................ | H01L 29/4991 257/408 |
| 9,385,124 B1* | 7/2016 | Peng ................ | H01L 21/823814 |
| 9,443,769 B2* | 9/2016 | Wang ................ | H10D 84/0149 |
| 9,543,211 B1 | 1/2017 | Lu et al. | |
| 9,601,567 B1* | 3/2017 | Hsieh ............... | H01L 21/823431 |
| 9,620,644 B2* | 4/2017 | Basker ............. | H01L 21/02164 |
| 9,768,278 B1 | 9/2017 | Chui et al. | |
| 9,806,155 B1* | 10/2017 | Basker ............. | H01L 21/823431 |
| 10,038,079 B1* | 7/2018 | Ohtou ............. | H01L 21/823431 |
| 10,050,149 B1* | 8/2018 | Huang .............. | H10D 30/6211 |
| 10,083,863 B1* | 9/2018 | Hsieh ............... | H01L 21/76895 |
| 10,164,012 B2* | 12/2018 | Fung ................ | H01L 29/0843 |
| 10,164,050 B2* | 12/2018 | Young .............. | H10D 64/021 |
| 10,468,491 B1* | 11/2019 | Clevenger ......... | H01L 21/76877 |
| 10,505,021 B2* | 12/2019 | Ko .................. | H01L 29/66795 |
| 10,797,157 B1* | 10/2020 | Chuang ............ | H01L 21/02255 |
| 10,861,952 B2* | 12/2020 | Ching .............. | H01L 29/04 |
| 11,081,401 B2* | 8/2021 | Chen ................ | H01L 29/7843 |
| 11,094,796 B2* | 8/2021 | Yang ............... | H01L 21/02118 |
| 2005/0048753 A1* | 3/2005 | Schwan ............ | H01L 29/6656 438/303 |
| 2005/0118809 A1* | 6/2005 | Noguchi ........... | H01L 21/31116 257/E21.228 |
| 2005/0148144 A1* | 7/2005 | Chou ............... | H01L 21/02164 257/E21.279 |
| 2006/0113675 A1 | 6/2006 | Chang et al. | |
| 2006/0138478 A1* | 6/2006 | Buh ................. | H01L 29/40117 257/E21.21 |
| 2006/0180894 A1 | 8/2006 | Kumura et al. | |
| 2006/0199367 A1 | 9/2006 | Huang et al. | |
| 2006/0220152 A1* | 10/2006 | Huang .............. | H01L 29/6659 257/408 |
| 2009/0087983 A1* | 4/2009 | Lee .................. | H01L 21/76877 438/655 |
| 2009/0104764 A1* | 4/2009 | Xia .................. | H01L 21/76829 257/E21.294 |
| 2009/0206406 A1* | 8/2009 | Rachmady ........ | H01L 21/28114 257/E29.264 |
| 2010/0041207 A1* | 2/2010 | Lee .................. | H01L 21/31612 257/E21.546 |
| 2010/0081246 A1* | 4/2010 | Shin ................ | H01L 21/265 438/303 |
| 2011/0013133 A1* | 1/2011 | Li .................... | H01L 21/02126 257/53 |
| 2012/0094459 A1* | 4/2012 | Park ................ | H01L 21/823807 257/E21.409 |
| 2014/0117334 A1 | 5/2014 | Nakamura et al. | |
| 2014/0353734 A1* | 12/2014 | Xie .................. | H01L 21/28088 257/288 |
| 2014/0367751 A1* | 12/2014 | Yu ................... | H01L 29/785 438/585 |
| 2015/0035152 A1* | 2/2015 | Zhou ............... | H01L 23/53295 438/653 |
| 2015/0145073 A1* | 5/2015 | Lee .................. | H01L 29/6653 257/411 |
| 2015/0228788 A1* | 8/2015 | Chen ................ | H01L 29/66545 257/288 |
| 2015/0255569 A1* | 9/2015 | Kim ................. | H01L 29/66545 438/261 |
| 2015/0318288 A1* | 11/2015 | Lim ................. | H01L 29/66666 257/329 |
| 2016/0013313 A1* | 1/2016 | Cheng .............. | H01L 29/0847 257/408 |
| 2016/0049330 A1* | 2/2016 | Peng ................ | H01L 23/5226 257/774 |
| 2016/0064274 A1* | 3/2016 | Peng ................ | H01L 21/76808 257/774 |
| 2016/0111542 A1* | 4/2016 | Zhang .............. | H01L 29/6653 438/283 |
| 2016/0336264 A1 | 11/2016 | Rullan et al. | |
| 2017/0062584 A1* | 3/2017 | Basker ............. | H01L 29/1608 |
| 2017/0194430 A1* | 7/2017 | Wood .............. | H01L 29/0673 |
| 2019/0067129 A1 | 2/2019 | Weng et al. | |
| 2020/0066601 A1* | 2/2020 | Weng .............. | H01L 29/66795 |
| 2020/0135915 A1 | 4/2020 | Savant et al. | |
| 2020/0295163 A1 | 9/2020 | Chui et al. | |
| 2021/0098598 A1* | 4/2021 | Yang ............... | H10D 64/021 |
| 2021/0125875 A1* | 4/2021 | Tsai ................. | H01L 21/823481 |
| 2021/0407819 A1* | 12/2021 | Wei ................. | H01L 21/3212 |

\* cited by examiner

METHOD FOR FORMING SEMICONDUCTOR DEVICE AND RESULTING DEVICE

CROSS-REFERENCE TO RELATED APPLICATION

This application is a continuation of U.S. patent application Ser. No. 16/673,794, filed Nov. 4, 2019, which is a divisional application of U.S. patent application Ser. No. 15/690,340, filed Aug. 30, 2017, now U.S. Pat. No. 10,504,797, each of which are incorporated by reference herein in their entireties.

BACKGROUND

This disclosure relates to semiconductor devices and methods of making the same. More particularly, the disclosed subject matter relates to a method for making a device comprising forming a dielectric layer adjacent to a gate structure, and the resulting device.

As complementary metal oxide semiconductor (CMOS) devices are scaled to smaller sizes, new materials and concepts are being considered to meet advanced performance targets. CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals. One performance criterion for NMOS and PMOS MOSFETS, and various other devices, is device switching frequency. Contacts are made to the gate electrodes, and to both the source and drain regions, of the transistors.

A thin dielectric layer such as an oxide side wall is sometimes disposed between a gate electrode and an interlayer dielectric (ILD) layer. However, the dielectric constant (k) value of the oxide side wall is generally fixed and cannot be changed once it is formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a nano structure" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

As dimensions of semiconductor devices continue to decrease and packaging densities continue to increase, parasitic capacitance becomes more and more important to improve the operating speed of devices (e.g., transistors). For example, a gate structure of a transistor includes one or more sidewall spacers positioned adjacent to the gate structure. In some embodiments, the sidewall spacers are made of silicon nitride, which has a relatively high dielectric constant value (i.e., a high k value) of, e.g., about 7-8. As a result of the transistor structure, the high-k silicon nitride spacers usually tend to increase the parasitic capacitance between the gate electrode and self-alighted contacts on source/drain regions of the transistor, which reduces the switching speed of the transistor. Low-k dielectric materials (e.g., k<6) are needed to fabricate sidewall spacers in order to improve the transistor performance.

To reduce resistance-capacitance (RC) delay and enhance profile control, silicon oxide is replaced with silicon oxycarbonitride (e.g., SiOCN) as inter layer dielectrics (ILD). Silicon oxycarbonitride has higher dielectric constant (k) than silicon oxide. For example, silicon oxide has a dielectric constant (k) of about 4.0 while silicon oxycarbonitride has a k value of about 5 in some embodiments. Silicon oxycarbonitride also has higher etching rate than silicon dioxide. On the other hand, the dielectric constant (k) value of a dielectric material such as side wall spacers is generally fixed and cannot be changed once it is formed. Therefore, suitable low-k dielectric materials are needed to be disposed between a gate structure and the ILD when the ILD comprises silicon oxycarbonitride, and the low-k dielectric materials having adjustable dielectric constant are more desirable to provide design and manufacturing flexibilities.

The present disclosure provides a method for forming a semiconductor device, and the resulting semiconductor device. The method comprises a step of forming a first dielectric layer through molecular-ion implantation for achieving adjustable and low dielectric constant (k) value. Such a first dielectric layer is disposed between a gate structure having a gate electrode and an ILD layer.

Figure 1A:
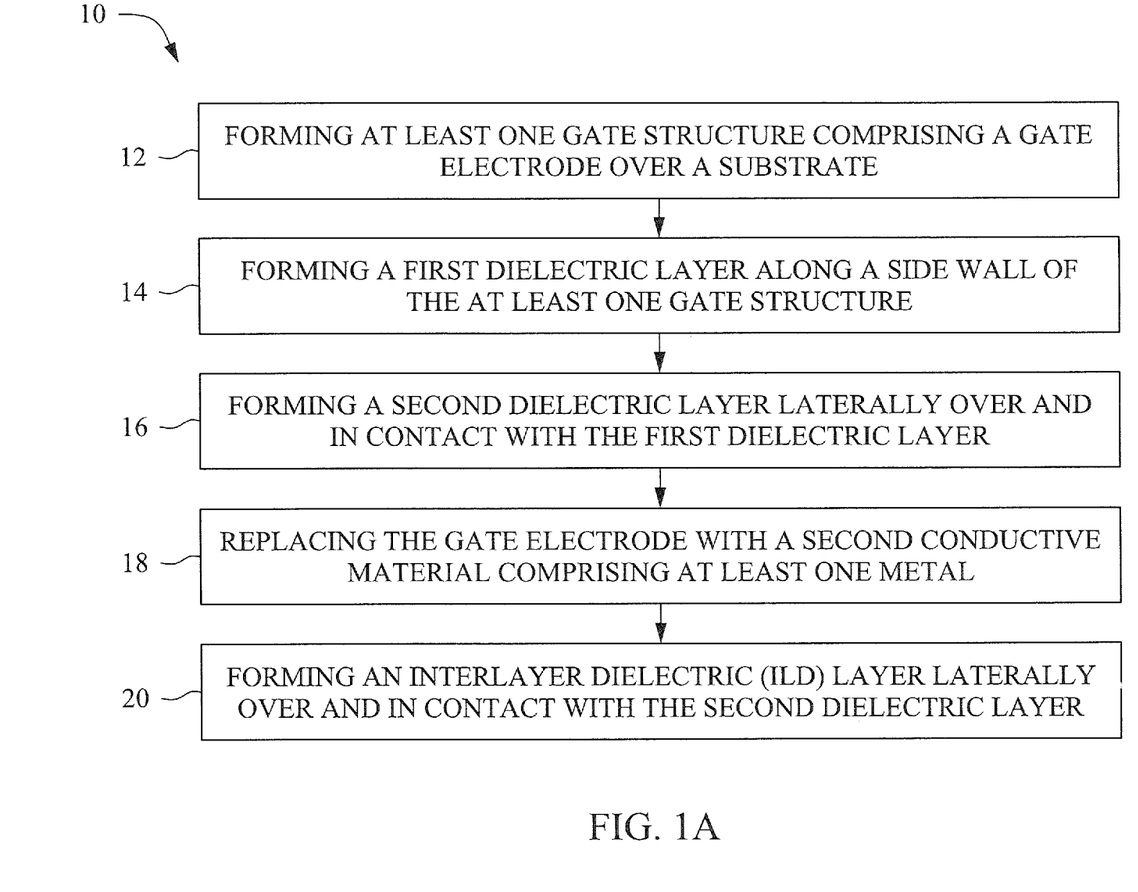
FIG. 1A is a flow chart illustrating an exemplary method for forming a semiconductor device in accordance with some embodiments.
Figure 1B:
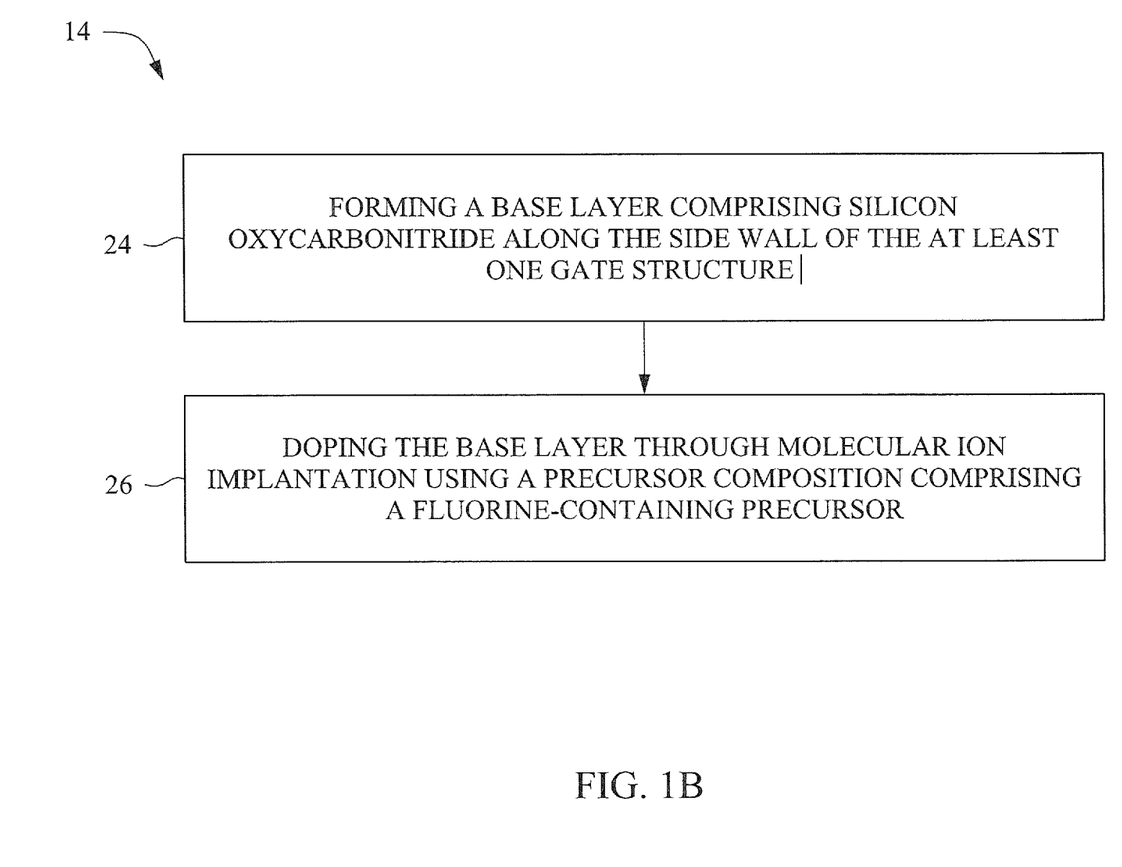
FIG. 1B is a flow chart illustrating an exemplary method for forming a first dielectric layer in accordance with some embodiments.

The methods described in FIGS. 1A-1B are described with reference to the exemplary structure described in FIGS. 2-9. Unless expressly indicated otherwise, the sequence of performing the steps of the methods in the flow charts are for illustration only, is not fixed and may be changed or switched. In FIGS. 2-9, like items are indicated by like reference numerals, and for brevity, descriptions of the structure, provided above with reference to the preceding figures, are not repeated.

For brevity, unless expressly indicated otherwise, references to a "silicon oxycarbonitride" made below will be understood to encompass a compound comprising silicon, oxygen, carbon and nitrogen at any suitable ratio. A compound having a formula SiOCN is just one exemplary compound. Such a compound may contain a small amount (e.g., <5 wt. %) of hydrogen in some embodiments.

References to a "silicon oxycarbide" made below will be understood to encompass a compound comprising silicon, oxygen, and carbon at any suitable ratio. A compound having a formula SiOC is just one exemplary compound. Such a compound may contain a small amount (e.g., <5 wt. %) of hydrogen in some embodiments.

References to a "fluorine doped silicon oxycarbonitride" or "fluorine doped silicon oxycarbide" made below will be understood to encompass silicon oxycarbonitride or silicon oxycarbide, respectively, which contains a suitable amount of fluorine, and optionally contains a small amount (<5 wt. %, 2 wt. % or 1 wt. %) of hydrogen. In some embodiments, fluorine doped silicon oxycarbonitride or silicon oxycarbide contains no hydrogen.

Unless expressly indicated otherwise, references to "silicon nitride" made below will be understood to encompass a material comprising silicon and nitrogen at any ratio (e.g., $Si_3N_4$). Polysilicon, or poly-si, is polycrystalline silicon, which is a high purity, polycrystalline form of silicon.

Figure 2:
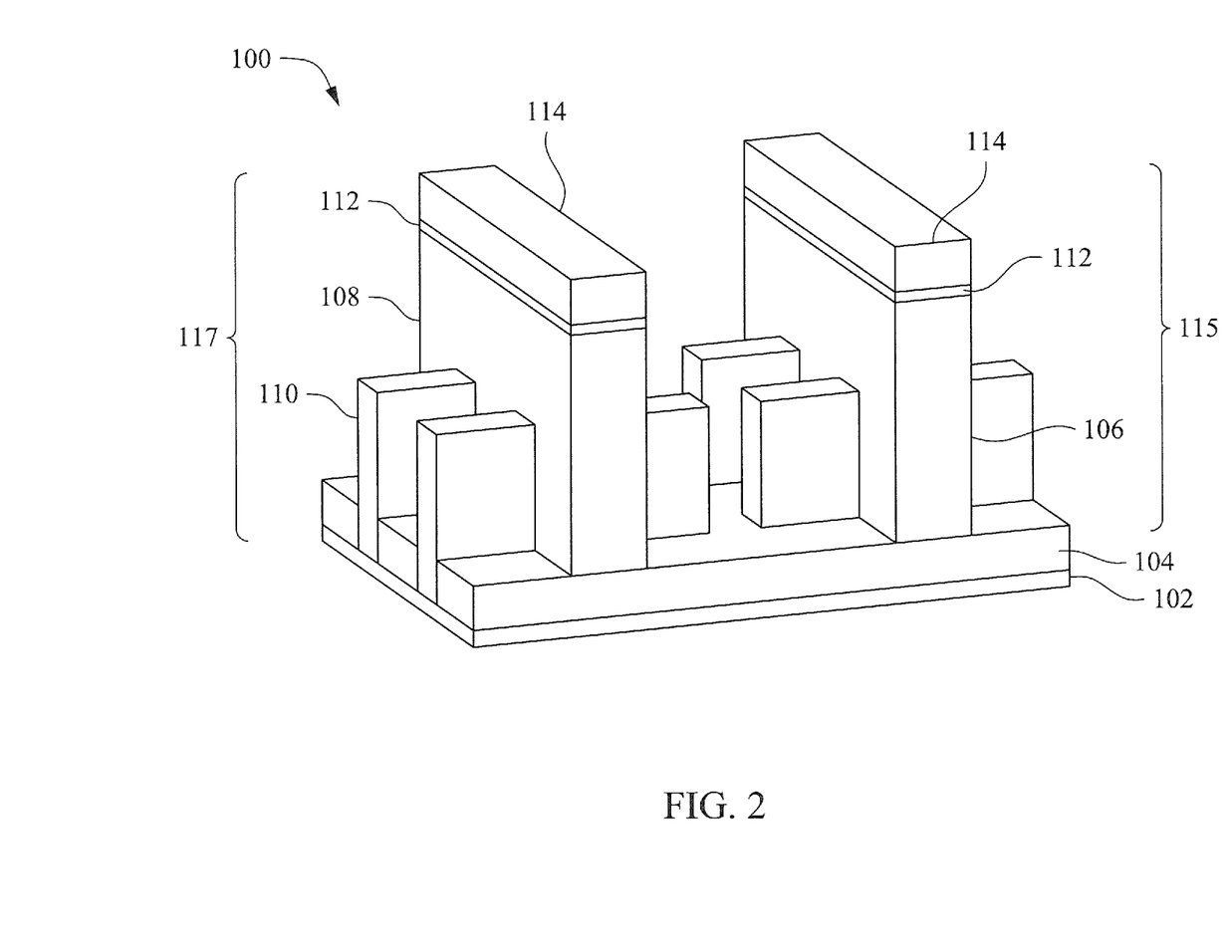
FIG. 2 is a perspective view of a portion of an exemplary device during fabrication, in which at least one gate structure is disposed over a substrate in accordance with some embodiments.

Referring to FIG. 1A, an exemplary method 10 for making a semiconductor device is illustrated. At step 12, at least one gate structure 115 and/or 117 (FIG. 2) comprising a gate electrode 106 and/or 108 is formed over a substrate 102. The gate electrode 106 and/or 108 comprises a first conductive material. Referring to FIG. 2, in some embodiments, a portion of a semiconductor device 100 comprises gate structures 115, 117 formed above semiconductor substrate 102.

Substrate 102 can be a wafer comprising a semiconductor material. Examples of suitable materials for substrate 102 include, but are not limited to, silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

An isolator layer or isolation structure such as a shallow trench isolation (STI) regions 104 is formed above substrate 102. STI regions 104 provide electrical isolation of the semiconductor regions separated by the STI regions 104. STI regions 104 are filled with an insulating material which may be, for example, a high density plasma oxide (HDP) material.

The gate electrode 106 or 108 comprises a first conductive (or semiconductor) material. Gate electrode 106 and 108 may comprise the same material. Examples of suitable materials for gate electrode 106 or 108 include, but are not limited to, amorphous silicon, polysilicon, polysilicon/germanium, or any other semiconductor material, which may be optionally doped. Gate electrode 106 or 108 may be a semiconductor region in some embodiments. In some embodiments, gate electrode 106 or 108 comprises or is made of polysilicon, and are formed on or above the STI regions 104. Such gate electrode comprising polysilicon is to be replaced with a metal electrode after subsequent processing steps. In some other embodiments, the first conductive material for gate electrode 106 or 108 comprises a metal.

As illustrated in FIG. 2, the gate structures 115 and 117 include fins 110 coupled with the gate electrode 106 and 108, which may comprise polysilicon. Such gate structures with fins 110 are for fabrication of device gates. Fins 110 may comprise a semiconductor material such as silicon (e.g., polysilicon) and are converted into source/drain regions. Fins 110 for gate structures 115 and 117 may be the same, and are to be doped with different dopant type or concentration for making NMOS or PMOS transistors at subsequent steps. These structures are for illustration only. In some embodiments, the gate structures 115 and 117 without fins may be used for fabrication of a dummy gate 500, which may include a resistor-capacitor (RC) structure. In some embodiments, insulating materials such as a layer of silicon nitride 112 and a layer of silicon oxide 114 may be disposed above gate electrode 106, 108.

At step 14 of FIG. 1A, a first dielectric layer 122 of a first dielectric material is formed along a side wall of the at least one gate structure 115 or 117. The first dielectric layer 122 of the first dielectric material comprises fluorine doped silicon oxycarbonitride or silicon oxycarbide with a doping concentration of fluorine.

Referring to FIG. 1B, in some embodiments, the step of forming a first dielectric layer 122 of a first dielectric material (i.e. step 14) comprises two steps.

Figure 3:
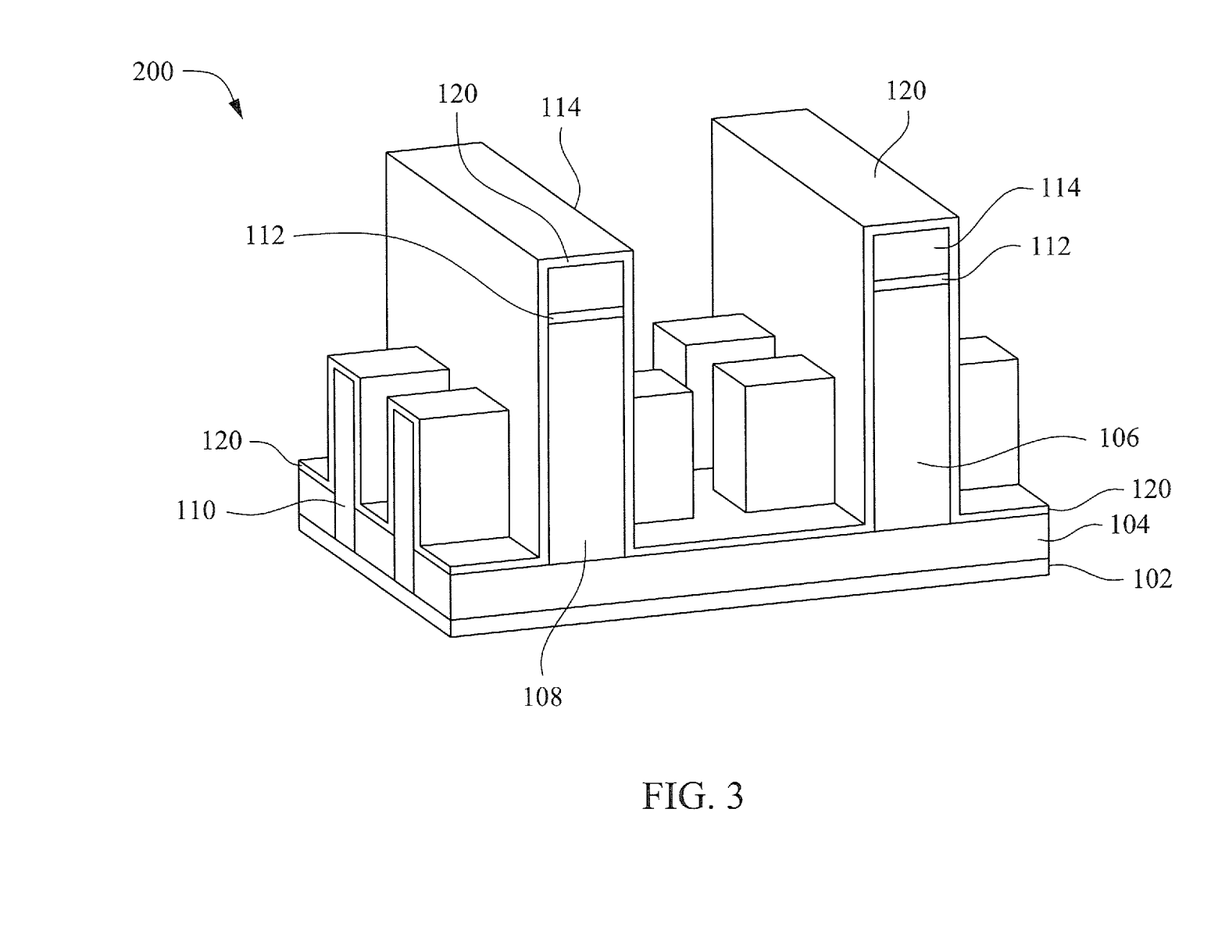
FIG. 3 is a perspective view of the device structure after a base layer for a first dielectric layer is formed over the exemplary device of FIG. 2.

At step 24, a base layer 120 is formed along the side wall of the at least one gate structure 115, 117. The base layer 120 may be formed over gate structures 115 and 117, and over the substrate 102. The resulting structure 200 is illustrated in FIG. 3. The base layer 120 comprises silicon oxycarbonitride, silicon oxycarbide, the like or any other suitable material in some embodiments. The base layer is made of silicon oxycarbonitride (e.g., SiOCN) in some embodiments.

Referring to FIG. 3, the base layer 120 may be formed through atomic layer deposition (ALD) or plasma-enhanced chemical vapor deposition in some embodiments. The thickness may be at the Angstrom or several nanometer level. In some embodiments, a base layer 120 comprising silicon oxycarbonitride may be deposited using a silicon-containing gas, a carbon-containing gas, a nitrogen-containing gas and an oxygen-containing gas. For example, examples of a suitable silicon-containing gas include, but are not limited to, silane and tetramethyl silane. Examples of a suitable carbon-containing gas include, but are not limited to, methane, and $C_3H_6$ gas. Examples of a suitable nitrogen-containing gas include, but are not limited to, $NH_3$ and nitrous oxide gas. Examples of a suitable oxygen-containing gas include, but are not limited to, $O_2$ gas. The pressure in the processing chamber or the processing conditions of the gas supply time, and so on are controlled, a ratio of the respective elements, i.e., a silicon element, an oxygen element, a carbon element, and a nitrogen element in the base layer 120, i.e., a silicon concentration, an oxygen concentration, a carbon concentration, and a nitrogen concentration, can be adjusted to control the composition ratio of the silicon oxycarbonitride film. The base layer 120 may be grown at an increased temperature in a range from about 100° C. to about 400° C. The base layer 120 may optionally include a small amount of hydrogen.

In some embodiments, a thin film of silicon carbonitride (e.g., SiCN) may be formed first. A silicon oxycarbonitride film as the base layer 120 may be formed by oxidizing the thin film of silicon carbonitride with oxygen. A base layer 120 comprising silicon oxycarbide may be deposited using a silicon-containing gas, a carbon-containing gas, and an oxygen-containing gas as described above.

Figure 4:
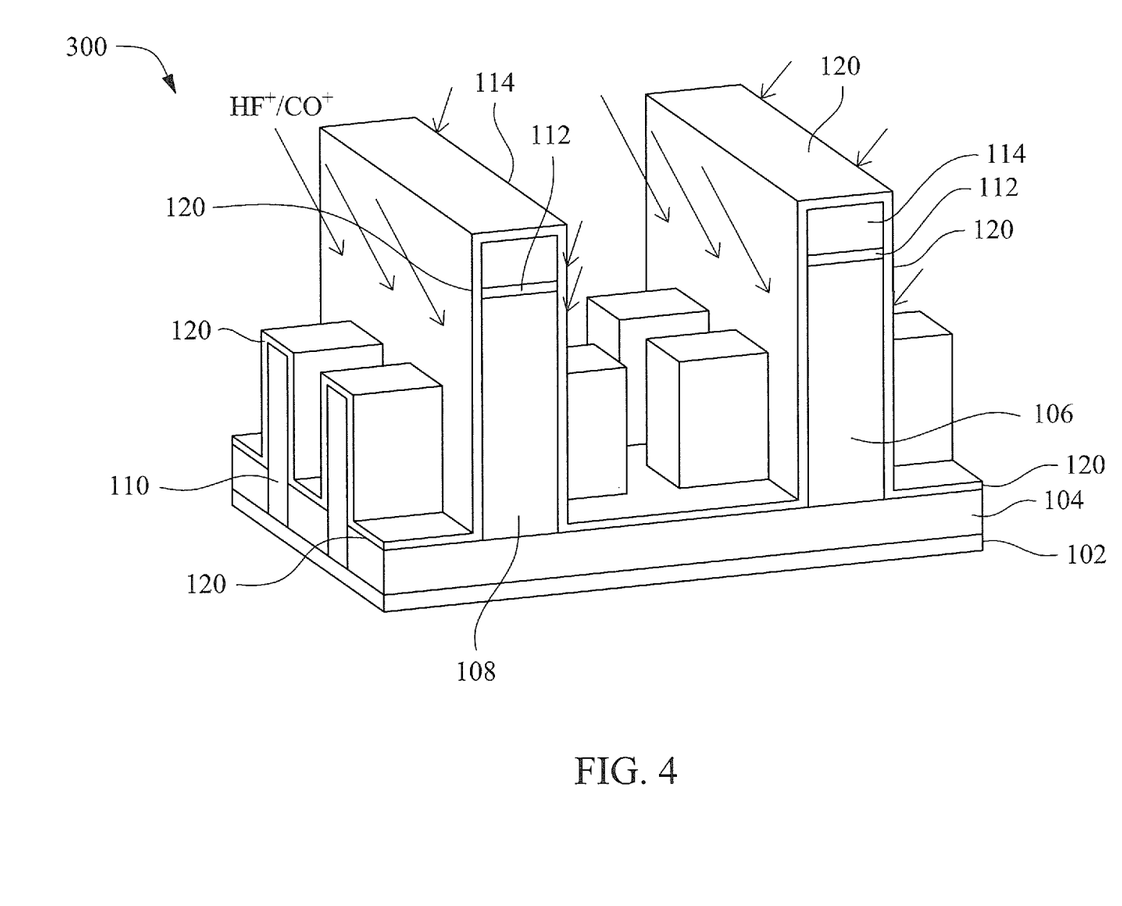
FIG. 4 illustrates a step of doping the base layer in the exemplary device of FIG. 3 through molecular ion implantation using a precursor composition in accordance with some embodiments.
Figure 5:
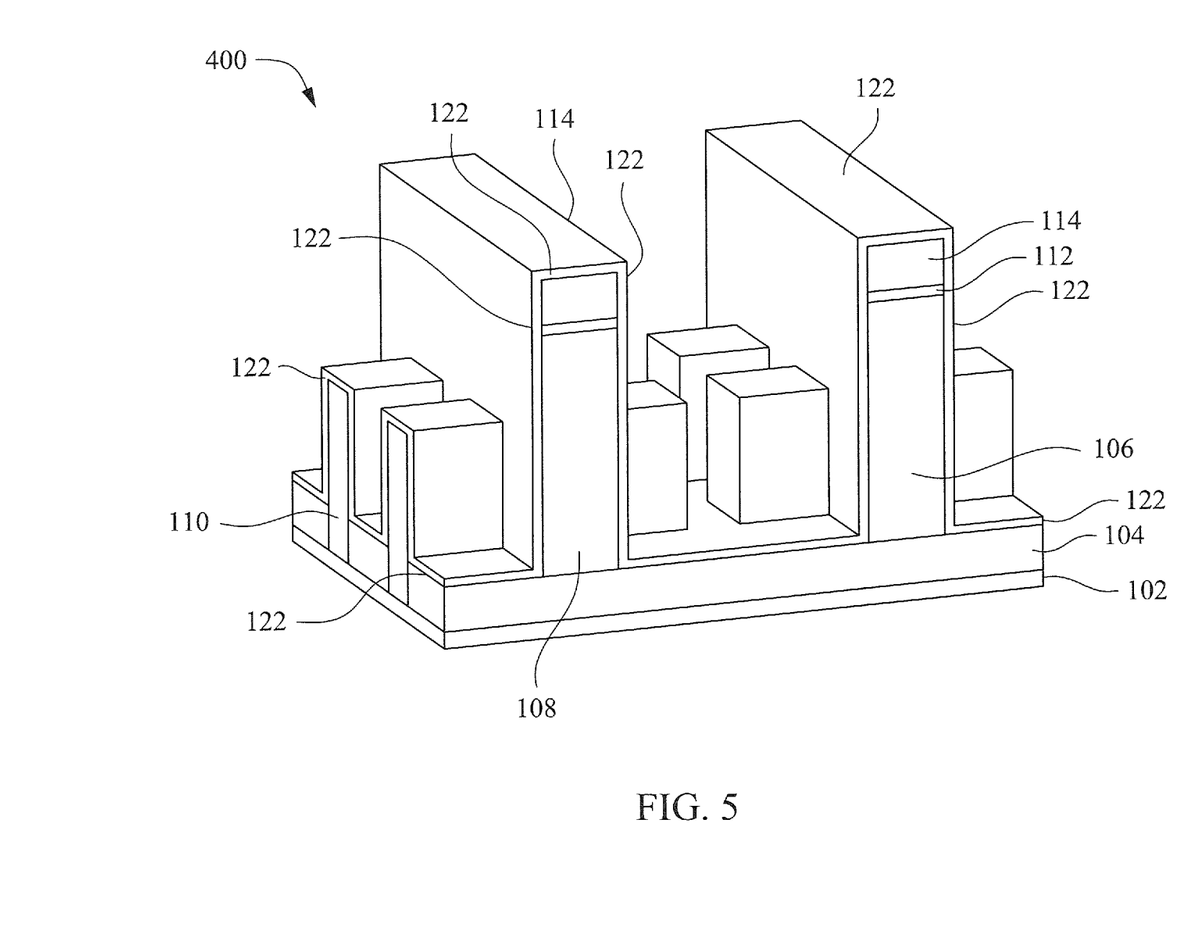
FIG. 5 is a perspective view of the device structure after a first dielectric layer is formed over the exemplary device of FIG. 2.

At step 26, the base layer 120 is doped through molecular ion implantation using a precursor composition comprising a fluorine-containing precursor. FIG. 4 illustrates an exemplary device 300 being processed at step 26. The resulting device structure 400 after step 26 is illustrated in FIG. 5. The base layer 120 is converted into the first dielectric layer 122. Implantation of dopant ions is carried out by molecular ion implantation. In some embodiments, carbon and oxygen may be implanted together with fluorine.

In some embodiments, the fluorine-containing precursor comprises hydrogen fluoride (HF). The precursor composition may further comprise a carbon or oxygen-containing precursor such as carbon monoxide (CO). In some embodiments, a mixture of HF and CO at any suitable ration is used. The ratio of HF:CO (or $HF^+:CO^+$) by volume or by moles is in a range from about 1:5 to 5:1, for example, about 1:1 in some embodiments. The ratio of HF:CO can be adjusted by adjusting the flow rate of the two gases. For example, a same flow range in a range of from 0.2 to 1 sccm (e.g., 0.5-0.7 sccm) is used to achieve a ratio of HF:CO to be 1:1. The reaction temperature may be in a range of from about 0° C. to about 100° C., for example, from about 0° C. to about 50° C. The energy for generating molecular ions may be in a range of from 0.5 KeV to about 100 KeV, for example, from 10 KeV to about 60 KeV.

At step 26, the base layer 120 comprising silicon oxycarbonitride (e.g., SiOCN), silicon oxycarbide (e.g., SiOC) is doped with fluorine. The resulting first dielectric layer 122 comprises fluorine doped silicon oxycarbonitride (e.g., F—SiOCN), or silicon oxycarbide (e.g., F—SiOC). In some embodiments, a small amount of hydrogen is present, for example, F—SiOCNH, or F—SiOCH. In some embodiments, no hydrogen is present in the first dielectric layer 122.

Step 26 may also comprise a step of adjusting the content of the fluorine-containing precursor such as HF. The dielectric constant of the first dielectric layer 122 is adjusted through the doping concentration of fluorine. In some embodiments, the doping concentration of fluorine in the first dielectric layer is in a range of from about $1\times10^3$ to about $1\times10^6$ atoms/cm$^3$. The dielectric constant of the first dielectric layer is in a range of from about 2 to about 3 (for example, in the range of from about 2.3 to about 2.8, or from about 2.4 to about 2.6). In some embodiments, the dielectric constant of the first dielectric layer 122 can be tailored to be a predetermined level or value by adjusting the content of the fluorine-containing precursor, thus the doping concentration of fluorine in the first dielectric layer 122. Silicon oxycarbonitride may have a dielectric constant in a range from about 4 to about 6 (e.g., about 5). When silicon oxycarbonitride is doped with fluorine, the dielectric constant is reduced by at least 50% in some embodiments.

Figure 6:
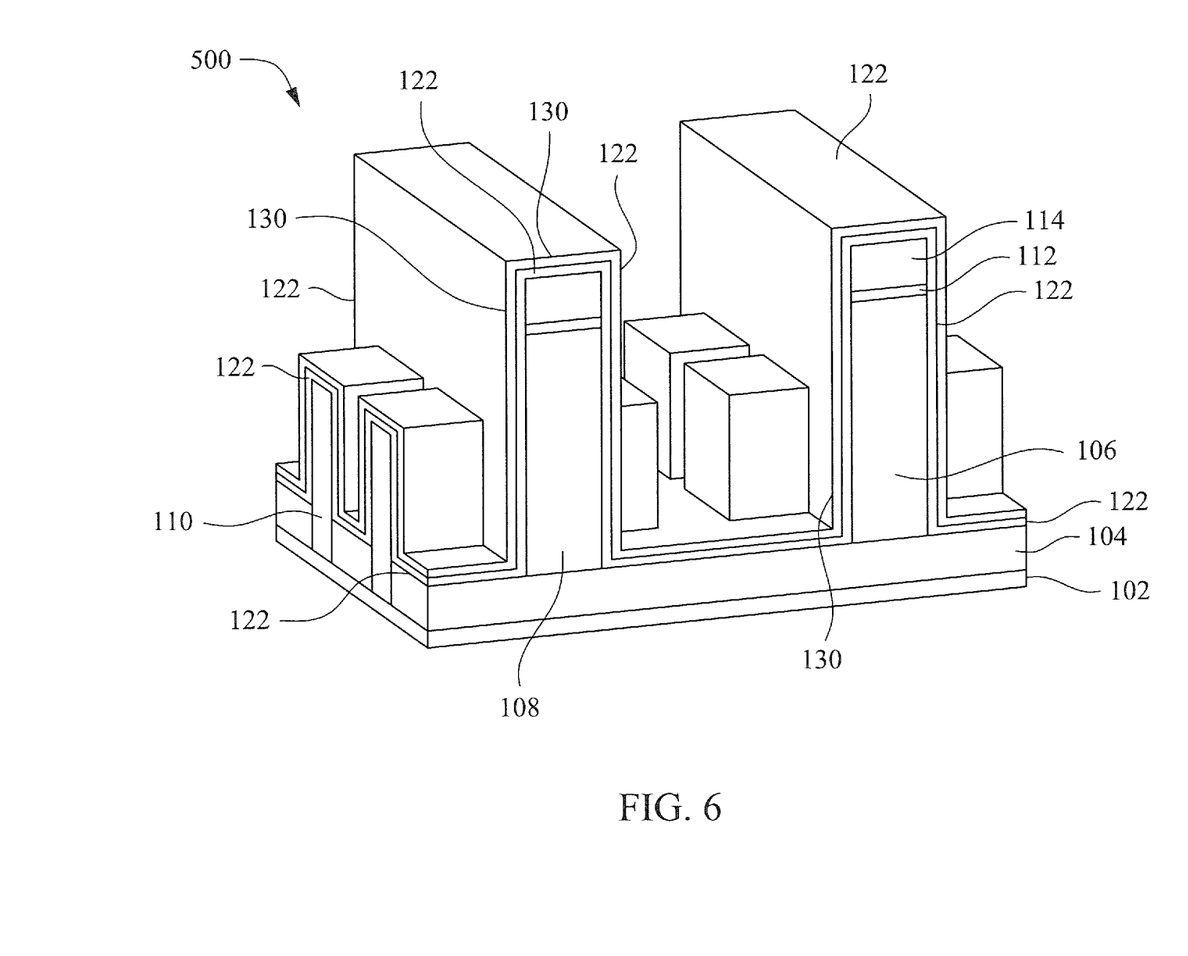
FIG. 6 illustrates the device structure after a second dielectric layer is formed over the exemplary device of FIG. 5.

Referring back to FIG. 1A, at step 16, a second dielectric layer 130 of a second dielectric material is formed laterally over and in contact with the first dielectric layer 122. The second dielectric layer 130 may be formed over the exemplary device 400. The resulting device structure 500 is illustrated in FIG. 6.

The second dielectric material comprises a suitable material such as silicon nitride, which may be formed using an atomic layer deposition (ALD) technique. The second dielectric layer 130 comprising silicon nitride may have a dielectric constant in a range from about 6 to 8 (e.g., 7-8).

Figure 7:
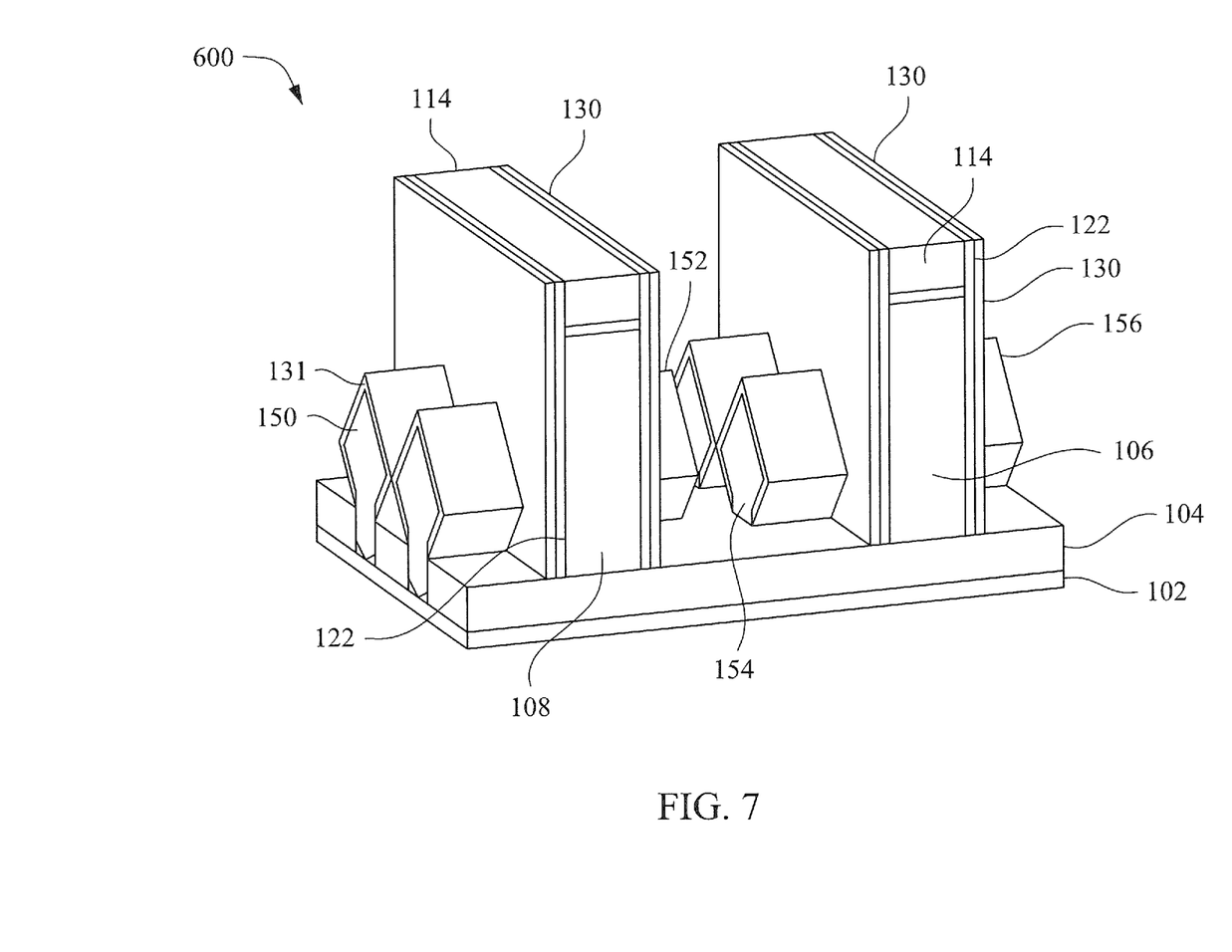
FIG. 7 illustrates the device structure after source/drain (S/D) regions are formed in the fins of the exemplary device of FIG. 6 in some embodiments.

Method 10 can also comprise steps of forming other portions (not shown) of a semiconductor device on or above substrate 102. For example, the other portions can include one or more of a buffer layer, a channel layer, a source region and a drain region. The method can comprise in-situ doping to form a source region and a drain region in the surface of substrate 102. For example, fins 110 may comprise a semiconductor material such as silicon and are converted into source/drain regions 150, 152, 154, and 156. The resulting device structure 600 is illustrated in FIG. 7. Fins 110 may be etched, and the source/drain regions 150, 152, 154, and 156 are formed epitaxial growth and in-situ or subsequent doping. Source/drain regions 150, and 152 may form at least one NMOS transistor while source/drain regions 154 and 156 may form at least one PMOS transistor, vice versa. A dielectric layer 131 comprising a material such as silicon nitride or silicon oxide is formed over the source/drain regions 150, 152, 154, and 156. The channel layers (not shown) are disposed between the source and drain regions and throughout gate electrodes 106 and 108 in some embodiments. Referring to FIG. 7, in some embodiments, the top portion of the second dielectric layer 130 disposed above layer 114 may be etched away.

Figure 8:
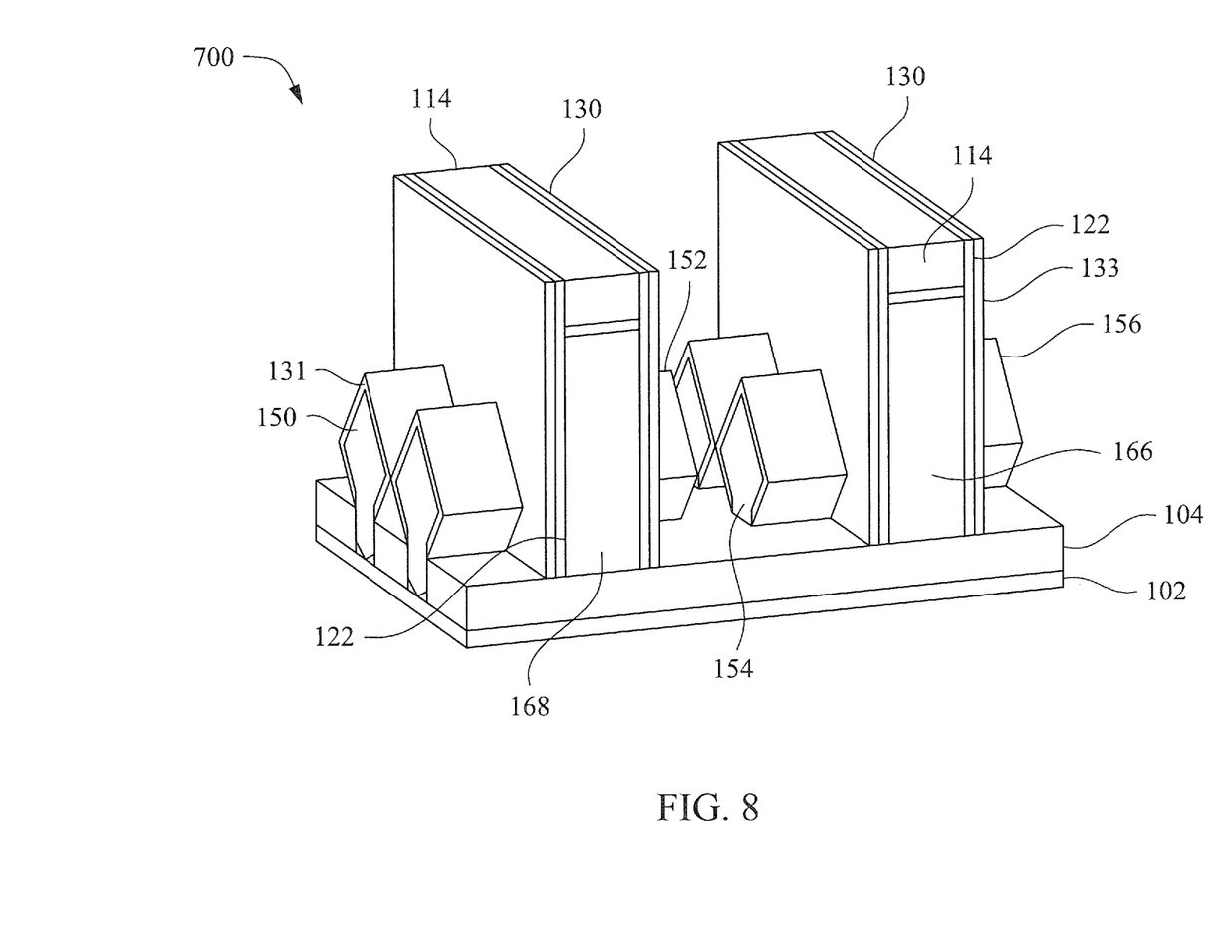
FIG. 8 illustrates the structure of the exemplary device of FIG. 7 after the first conductive material (e.g., polysilicon) in the gate electrode is replaced with a second conductive material (e.g., metal) in accordance with some embodiments.

Method 10 may also comprise an optional step 18. At step 18, the first conductive material in the gate electrodes 106 and 108 is replaced with a second conductive material comprising at least one metal to form metal gate electrodes 166 and 168. The resulting exemplary device structure 700 is illustrated in FIG. 8.

In some embodiments, the first conductive material in the gate electrode 106 or 108 comprises polysilicon. Such polysilicon gate electrodes may be replaced with a second conductive material comprising at least one metal to form metal gates. At step 18, an ILD layer may be formed over the exemplary device 600 first. Insulating materials such as layers 112 and 114, and gate electrodes 106 and 108 are then etched to form trenches, which are filled with the second conductive material to form metal gate electrodes 166 and 168. The insulating materials including layer of silicon nitride 112 and layer of silicon oxide 114 may be disposed above metal gate electrodes 166 and 168.

Examples of suitable material for metal gate electrodes 166 and 168 include but are not limited to tungsten, aluminum, copper, titanium, tantalum, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, metal gate electrodes 166 and 168 are made of tungsten.

In addition to the metal gate electrodes 166 and 168, there might be multiple layers between a metal gate electrode 166 and 168 and the second dielectric layer 130 or the STI region 104. For example, the metal gate structures may also comprise a high-k dielectric such as hafnium oxide (HfO$_2$), a work function material layer such as titanium nitride. The metal gates comprising metal gate electrodes 166 and 168 are device gates when coupled with the fins having any of source/drain regions 150, 152, 154, and 156. In some other embodiments, the metal gates may be a dummy gate providing RC structures. The multiple-layer structure and the RC structures are described in a co-pending application, U.S. Provisional Application No. 62/511,373 filed May 26, 2017, which is incorporated by reference in its entirety.

Figure 9:
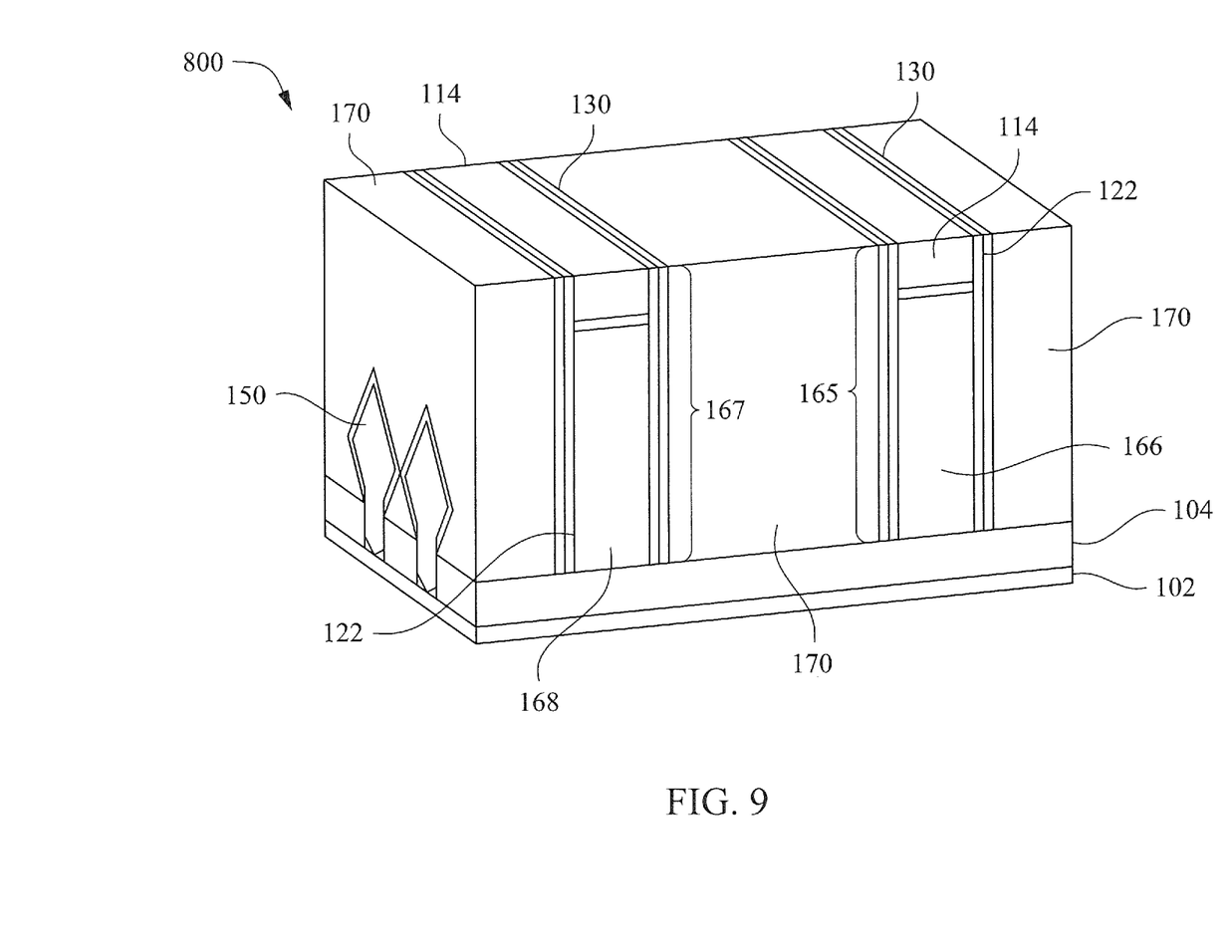
FIG. 9 is a perspective view of a resulting exemplary device comprising an interlayer dielectric (ILD) layer in accordance with some embodiments.

At step 20, an interlayer dielectric (ILD) layer 170 is formed laterally over and in contact with the second dielectric layer 130. ILD layer 170 may be formed over the exemplary structure 700. The resulting exemplary device 800 is illustrated in FIG. 9. The first and the second dielectric layers 122 and 130 function as spacers between a gate electrode 166 or 168 and the interlayer dielectric (ILD). Examples of suitable materials for the ILD layer 170 include but are not limited to silicon oxycarbonitride, silicon oxide, silicon oxynitride, phosphosilicate glass (PSG), borophosphosilicate glass (BPSG), combinations thereof, or other suitable material. The ILD layer 170 can be formed by using CVD, high density plasma CVD, spin-on, sputtering, or other suitable method. The ILD layer 170 comprises a suitable material such as silicon oxycarbonitride in some embodiments. The ILD layer comprising silicon oxycarbonitride may have a dielectric constant in a range from about 4 to about 6 (e.g., about 5).

Referring to FIG. 9, exemplary semiconductor device 800 comprises at least one gate structure 165 or 167 comprising a gate electrode 166 or 168 over a substrate 102, and a first dielectric layer 122 disposed along one or more side wall of the at least one gate structure 165 or 167. The gate electrode 166 or 168 comprises a conductive material. The first dielectric layer 122 comprises fluorine doped silicon oxycarbonitride or silicon oxycarbide with a doping concentration of fluorine. In some embodiments, the doping concentration of fluorine is in a range of from about 1×10$^3$ to about 1×10$^6$ atoms/cm$^3$. The first dielectric layer 122 has a dielectric constant in a range of from about 2 to about 3 (for example, in the range of from about 2.3 to about 2.8, or from about 2.4 to about 2.6).

Exemplary device 800 may further comprise a second dielectric layer 130 laterally over and in contact with the first dielectric layer 122, and an interlayer dielectric (ILD) 170 layer laterally over and in contact with the second dielectric layer 130. In some embodiments, the second dielectric material 130 comprises silicon nitride, and the ILD layer 170 comprises silicon oxycarbonitride. In some embodiments, the gate electrode 165 or 167 comprises polysilicon or metal. The gate structure 165 or 167 can be a device gate in some embodiments or a dummy gate in some other embodiments. The dummy gate may comprise a resistor-capacitor (RC) structure.

The present disclosure provides a method for forming a semiconductor device and the resulting semiconductor device. Such a method comprising steps of: forming at least one gate structure comprising a gate electrode over a substrate, and forming a first dielectric layer of a first dielectric material along a side wall of the at least one gate structure. The gate electrode comprises a first conductive material. The first dielectric layer of the first dielectric material comprises fluorine doped silicon oxycarbonitride or silicon oxycarbide with a doping concentration of fluorine.

In some embodiments, the step of forming a first dielectric layer of a first dielectric material comprises: forming a base layer comprising silicon oxycarbonitride or silicon oxycarbide along the side wall of the at least one gate structure, and doping the base layer through molecular ion implantation using a precursor composition comprising a fluorine-containing precursor. The base layer may be formed using an atomic layer deposition (ALD) technique. In some embodiments, the fluorine-containing precursor comprises hydrogen fluoride (HF).

The dielectric constant of the first dielectric layer is adjusted through the doping concentration of fluorine. In some embodiments, the doping concentration of fluorine in the first dielectric layer is in a range of from about 1×10$^3$ to about 1×10$^6$ atoms/cm$^3$. The dielectric constant of the first dielectric layer is in a range of from about 2 to about 3 (for example, in the range of from about 2.3 to about 2.8, or from about 2.4 to about 2.6).

The method further comprises forming a second dielectric layer of a second dielectric material laterally over and in contact with the first dielectric layer. The method further comprises forming an interlayer dielectric (ILD) layer laterally over and in contact with the second dielectric layer. The second dielectric material comprises a suitable material such as silicon nitride, which may be formed using an atomic layer deposition (ALD) technique. The ILD layer comprises a suitable material such as silicon oxycarbonitride in some embodiments. The ILD layer comprising silicon oxycarbonitride may have a dielectric constant in a range from about 4 to about 6 (e.g., about 5). The second dielectric layer comprising silicon nitride may have a dielectric constant in a range from about 6 to 8 (e.g., 7-8).

In some embodiments, the first conductive material in the gate electrode comprises polysilicon. The first conductive material in the gate electrode may be replaced with a second conductive material comprising at least one metal.

The present disclosure provides a method for forming a semiconductor device. Such a method comprises steps of forming at least one gate structure comprising a gate electrode over a substrate, forming a first dielectric layer along a side wall of the at least one gate structure. The gate electrode comprises a first conductive material, and forming a second dielectric layer comprising silicon nitride laterally over and in contact with the first dielectric layer. The first dielectric layer comprises fluorine doped silicon oxycarbonitride with a doping concentration of fluorine. In some embodiments, the step of forming a first dielectric layer of a first dielectric material comprises forming a base layer comprising silicon oxycarbonitride along the side wall of the at least one gate structure, and doping the base layer through molecular ion implantation using a precursor composition comprising hydrogen fluoride (HF). The precursor composition may further comprise a carbon or oxygen-containing precursor such as carbon monoxide (CO). In some embodiments, the ratio of HF:CO (or $HF^+:CO^+$) is 1:1. In some embodiments, such a method further comprises forming an interlayer dielectric (ILD) layer laterally over and in contact with the second dielectric layer; and replacing the first conductive material in the gate electrode with a second conductive material comprising at least one metal. The ILD layer comprises silicon oxycarbonitride in some embodiments.

In another aspect, the present disclosure provides a semiconductor device. Such a device comprises at least one gate structure comprising a gate electrode over a substrate, and a first dielectric layer disposed along one or more side wall of the at least one gate structure. The gate electrode comprises a conductive material. The first dielectric layer comprises fluorine doped silicon oxycarbonitride or silicon oxycarbide with a doping concentration of fluorine. In some embodiments, the doping concentration of fluorine is in a range of from about $1\times10^3$ to about $1\times10^6$ atoms/cm$^3$. The first dielectric layer has a dielectric constant in a range of from about 2 to about 3 (for example, in the range of from about 2.3 to about 2.8, or from about 2.4 to about 2.6).

The device may further comprise a second dielectric layer laterally over and in contact with the first dielectric layer, and an interlayer dielectric (ILD) layer laterally over and in contact with the second dielectric layer. In some embodiments, the second dielectric material comprises silicon nitride, and the ILD layer comprises silicon oxycarbonitride. In some embodiments, the gate electrode comprises polysilicon or metal. The gate structure can be a device gate in some embodiments or a dummy gate in some other embodiments. The dummy gate may comprise a resistor-capacitor (RC) structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   at least one gate structure comprising a gate electrode over a substrate, the gate electrode comprising a conductive material;
   a first dielectric layer disposed along one or more side walls of the at least one gate structure, the first dielectric layer comprising a material doped with fluorine based on molecular ion implantation using a precursor comprising hydrogen fluoride (HF) and carbon monoxide (CO),
   wherein a doping concentration of fluorine in the first dielectric layer is in a range of from about $1\times10^3$ to about $1\times10^6$ atoms/cm$^3$,
   wherein a dielectric constant of the first dielectric layer is established based on the doping concentration of fluorine, and
   wherein the material doped with fluorine comprises fluorine doped silicon oxycarbonitride or fluorine doped silicon oxycarbide; and
   a second dielectric layer disposed laterally over and in contact with the first dielectric layer such that the first dielectric layer is disposed between the gate electrode and the second dielectric layer and the second dielectric layer does not contact the gate electrode.

2. The semiconductor device of claim 1, wherein the precursor has a molar ratio of HF:CO in a range from about 1:5 to 5:1.

3. The semiconductor device of claim 1, wherein the dielectric constant is in a range of from about 2.3 to about 2.8.

4. The semiconductor device of claim 1, wherein the dielectric constant is in a range of from about 2.4 to about 2.6.

5. The semiconductor device of claim 1, further comprising an interlayer dielectric (ILD) layer laterally over and in contact with the second dielectric layer.

6. The semiconductor device of claim 5, wherein the second dielectric layer comprises silicon nitride, and the ILD layer comprises silicon oxycarbonitride.

7. The semiconductor device of claim 1, wherein the gate electrode comprises polysilicon or metal.

8. The semiconductor device of claim 1, further comprising:
   a source region formed over the substrate adjacent a first side of the gate electrode; and
   a drain region formed over the substrate adjacent a second side of the gate electrode, the second side being opposite to the first side with respect to the gate electrode.

9. The semiconductor device of claim 8, further comprising a third dielectric layer formed over the source region and the drain region.

10. The semiconductor device of claim 9, wherein the third dielectric layer comprises at least one of: silicon nitride and silicon oxide.

11. A semiconductor device, comprising:
    a first gate structure comprising a first gate electrode over a substrate, the first gate electrode comprising a conductive material;
    a second gate structure comprising a second gate electrode over the substrate, the second gate electrode comprising a second conductive material;
    an interlayer dielectric (ILD) layer disposed between the first and second gate electrodes;

a first spacer, disposed between the ILD layer and the first gate electrode, comprising a first dielectric layer that comprises a material doped with fluorine based on molecular ion implantation using a precursor comprising hydrogen fluoride (HF) and carbon monoxide (CO), wherein a doping concentration of fluorine in the first dielectric layer is in a range of from about $1 \times 10^3$ to about $1 \times 10^6$ atoms/cm$^3$, wherein a dielectric constant of the first dielectric layer is established based on the doping concentration of fluorine, and wherein the material doped with fluorine comprises fluorine doped silicon oxycarbonitride or fluorine doped silicon oxycarbide;

a second spacer disposed between the ILD layer and the second gate electrode;

a third spacer disposed between the ILD layer and the first spacer; and a fourth spacer disposed between the ILD layer and the second spacer, wherein the ILD layer is disposed laterally over and in contact with the third and fourth spacers, respectively.

12. The semiconductor device of claim 11, wherein a reaction temperature of the molecular ion implantation is in a range of from about 0° C. to about 100° C., and energy for generating molecular ions in the molecular ion implantation is in a range of from 0.5 KeV to about 100 KeV.

13. The semiconductor device of claim 11, wherein the precursor is a mixture of HF and CO having a molar ratio of HF:CO in a range from about 1:5 to 5:1.

14. The semiconductor device of claim 11, wherein each of the third and fourth spacers is formed from a second dielectric layer formed adjacent to and in contact with the first dielectric layer.

15. The semiconductor device of claim 14, wherein the second dielectric layer comprises silicon nitride, and the ILD layer comprises silicon oxycarbonitride.

16. A semiconductor device, comprising:
a gate structure comprising a gate electrode over a substrate, the gate electrode comprising a conductive material;
a first dielectric layer disposed along and in contact with first and second side walls of the gate electrode, the first and second side walls being opposite to each other, the first dielectric layer comprising a material doped with fluorine based on molecular ion implantation using a precursor comprising hydrogen fluoride (HF) and carbon monoxide (CO), wherein a doping concentration of fluorine in the first dielectric layer following the molecular ion implantation is in a range of from about $1 \times 10^3$ to about $1 \times 10^6$ atoms/cm$^3$, wherein a dielectric constant of the first dielectric layer is established based on the doping concentration of fluorine, and wherein the material doped with fluorine comprises fluorine doped silicon oxycarbonitride or fluorine doped silicon oxycarbide;

a source region formed over the substrate adjacent to the first side wall of the gate electrode;

a drain region formed over the substrate adjacent to the second side wall of the gate electrode;

an interlayer dielectric (ILD) layer disposed over the source region and the drain region, wherein the first dielectric layer is disposed between the ILD layer and each of the first and second side walls of the gate electrode; and a second dielectric layer disposed laterally over and in contact with the first dielectric layer such that the first dielectric layer is disposed between the gate electrode and the second dielectric layer and the second dielectric layer does not contact the gate electrode, and wherein the ILD layer is disposed laterally over and in contact with the second dielectric layer.

17. The semiconductor device of claim 16, wherein a reaction temperature of the molecular ion implantation is in a range of from about 0° C. to about 100° C., and energy for generating molecular ions in the molecular ion implantation is in a range of from 0.5 KeV to about 100 KeV.

18. The semiconductor device of claim 16, wherein the precursor is a mixture of HF and CO having a molar ratio of HF:CO in a range from about 1:5 to 5:1.

19. The semiconductor device of claim 16, wherein the second dielectric layer is formed adjacent to and in contact with the first dielectric layer and disposed between the first dielectric layer and the ILD layer at both the first side and the second side of the gate electrode.

20. The semiconductor device of claim 19, wherein the second dielectric layer comprises silicon nitride, and the ILD layer comprises silicon oxycarbonitride.

* * * * *